(12) United States Patent
Sugahara

(10) Patent No.: US 8,878,573 B2
(45) Date of Patent: Nov. 4, 2014

(54) VOLTAGE CONTROLLED SWITCHING ELEMENT GATE DRIVE CIRCUIT

(75) Inventor: Satoshi Sugahara, Matsumoto (JP)

(73) Assignee: Fuji Electric Co., Ltd., Kawasaki-Shi (JP)

( * ) Notice: Subject to any disclaimer, the term of this patent is extended or adjusted under 35 U.S.C. 154(b) by 0 days.

(21) Appl. No.: 13/480,441

(22) Filed: May 24, 2012

(65) Prior Publication Data

US 2012/0299624 A1 Nov. 29, 2012

(30) Foreign Application Priority Data

May 25, 2011 (JP) ................... 2011-116924

(51) Int. Cl.
*H03K 3/00* (2006.01)
*H03K 17/16* (2006.01)

(52) U.S. Cl.
CPC ...... *H03K 17/168* (2013.01); *H03K 2217/0081* (2013.01); *H03K 17/164* (2013.01)
USPC .............. 327/109; 327/112; 326/83

(58) Field of Classification Search
USPC ............. 327/108, 109, 112, 170, 380, 381; 326/82–85, 87
See application file for complete search history.

(56) References Cited

U.S. PATENT DOCUMENTS

| | | | |
|---|---|---|---|
| 6,271,709 B1 * | 8/2001 | Kimura et al. | 327/380 |
| 6,683,482 B2 * | 1/2004 | Humphrey et al. | 327/170 |
| 7,737,761 B2 * | 6/2010 | Ishikawa et al. | 327/380 |
| 7,902,885 B2 * | 3/2011 | Chauhan et al. | 327/117 |
| 2012/0293485 A1 * | 11/2012 | Chang et al. | 345/213 |

FOREIGN PATENT DOCUMENTS

| | | |
|---|---|---|
| JP | 10-032976 | 2/1998 |
| JP | 2000-324801 | 11/2000 |
| JP | 2005-278274 | 10/2005 |

* cited by examiner

*Primary Examiner* — Patrick O'Neill
(74) *Attorney, Agent, or Firm* — Rabin & Berdo, P.C.

(57) ABSTRACT

A voltage controlled switching element gate drive circuit makes it possible to suppress an occurrence of a malfunction, while suppressing surge voltage, surge current, and switching noise, when switching in a voltage controlled switching element. A gate drive circuit that supplies a gate voltage to the gate of a voltage controlled switching element, thus driving the voltage controlled switching element, includes a high potential side switching element and low potential side switching element connected in series, first variable resistors interposed between at least the high potential side switching element and a high potential power supply or the low potential side switching element and a low potential power supply, and a control circuit that adjusts the resistance values of the first variable resistors.

6 Claims, 16 Drawing Sheets

OUTPUT CURRENT

OUTPUT VOLTAGE

NO GATE RESISTOR

OUTPUT CURRENT

OUTPUT VOLTAGE

WITH GATE RESISTORS

VOLTAGE CONTROLLED SWITCHING ELEMENT GATE DRIVE CIRCUIT

CROSS-REFERENCE TO RELATED APPLICATION

This application claims priority under 35 U.S.C. §119 from Japanese Patent Application No. JP PA 2011-116924, filed on May 25, 2011, the entirety of which is incorporated herein by reference.

BACKGROUND OF THE INVENTION

1. Technical Field

The present invention relates to a gate drive circuit that drives the gate of a voltage controlled switching element.

2. Related Art

In general, as a gate drive circuit that drives the gate of a voltage controlled switching element such as an insulated gate bipolar transistor (hereafter called an IGBT) or MOS-FET, a gate resistor Rg is interposed between a gate drive circuit 100 and the gate of a voltage controlled switching element 101, as shown in FIG. 14, and gate drive capability is adjusted, in order to reduce switching noise and avoid element breakage caused by surge voltage when switching.

An example of a configuration of the gate drive circuit 100 incorporating a gate resistor corresponding to the resistor Rg is shown in FIG. 15. The gate drive circuit 100 shown in FIG. 15 has a configuration in which the source of a PMOS field effect transistor M1 is connected to the positive electrode side of a direct current power source 102 via a gate resistor R1, the drain of the PMOS field effect transistor M1 is connected to the drain of an NMOS field effect transistor M2, and the source of the NMOS field effect transistor M2 is connected to the negative electrode side of the direct current power source 102 via a gate resistor R2. Then, a first stage circuit 103 configured of, for example, an amplifier is connected to the gates of the PMOS field effect transistor M1 and the NMOS field effect transistor M2, and a drive signal formed by a pulse signal is input into the first stage circuit 103.

With the gate drive circuit of FIG. 15, noise, surge voltage, or surge current occurs in the output current and output voltage when the gate resistors R1 and R2 are not used, as shown in FIG. 16A, but when using the gate resistors R1 and R2, it is possible to suppress noise and surge voltage occurring in the output current and output voltage, as shown in FIG. 16B.

Then, when applying a voltage controlled switching element to, for example, a power conversion device, two voltage controlled switching elements Q1 and Q2 are connected in series, and the gates of the voltage controlled switching elements Q1 and Q2 are connected to gate drive circuits 100A and 100B respectively via gate resistors Ra and Rb, as shown in FIG. 17, and it is possible to obtain an output from a node N forming a connection point of the voltage controlled switching elements Q1 and Q2 by alternately turning the voltage controlled switching elements Q1 and Q2 on and off.

At this time, as the gate resistors Rg, Ra, and Rb are interposed, as shown in FIGS. 14 and 17, or the resistors R1 and R2 corresponding to the gate resistors Rg, Ra, and Rb are incorporated, as shown in FIG. 15, in the gate drive circuits 100A and 100B that drive the voltage controlled switching elements Q1 and Q2, the gate input impedance of the voltage controlled switching elements Q1 and Q2 increases in a case in which the voltage controlled switching elements Q1 and Q2 are shifted to an off condition, and also in a case in which an off condition is maintained. Because of this, with the configuration of FIG. 17, when the voltage controlled switching element Q2 is put into an off condition with the gate voltage of the voltage controlled switching element Q2 at an L (low) level, and the voltage of the node N rises owing to shifting the voltage controlled switching element Q1 to an on condition, the gate voltage of the voltage controlled switching element Q2 may rise as shown in FIGS. 18A and 18B due to the effect of a parasitic capacitor C shown by the dotted lines in FIG. 17. At this time, as both of the voltage controlled switching elements Q1 and Q2 are in an on condition, there is a danger of causing an increase in current consumption or a breakage of the voltage controlled switching elements Q1 and Q2. Therefore, although it is preferable that the gate resistances of the voltage controlled switching elements Q1 and Q2 are higher while the gate voltage is changing, it is preferable that the gate resistances are lower in a condition in which the gate voltage change is completed. However, with the gate drive circuits having the configurations of FIGS. 14 and 15, it is not possible to adjust the gate resistances in accordance with operating conditions and shift conditions of the voltage controlled switching elements Q1 and Q2.

In order to suppress an occurrence of this kind of surge voltage and surge current, and an occurrence of switching noise, there is proposed a self-arc-extinguishing semiconductor switching element drive circuit wherein, for example, a charge or discharge of the gate capacitance of an IGBT via a first gate resistor is started when the IGBT is turned on (or when the IGBT is turned off) and, when a voltage is generated at an inductor connected between an auxiliary emitter terminal and main emitter terminal of the IGBT, the gate capacitance of the IGBT is charged (or discharged) via a second gate resistor having a resistance value higher than that of the first resistor, alleviating the speed of a rise (or fall) of the current flowing through the IGBT (for example, refer to JP-A-10-32976).

However, in the heretofore known example described in JP-A-10-32976, the first gate resistor is used at the start of switching, after which, the second gate resistor having a resistance value higher than that of the first resistor is used, in order to suppress surge voltage by reducing the IGBT current change rate (di/dt) or (−di/dt) when switching, and to suppress switching noise caused by the voltage change rate (dV/dt) between the main terminals. Because of this, with the heretofore known example, although it is possible to suppress surge voltage, and to suppress switching noise, the first gate resistor (more specifically, a normally-on gate resistor 12 and a normally-off gate resistor 14 of JP-A-10-32976), which has a constant resistance value, is still connected even after the voltage controlled switching element has shifted to an off condition, meaning that, as previously described using FIG. 17, there is an unsolved problem in that, when the voltage controlled switching element Q2 is put into an off condition, the voltage controlled switching element Q1 is shifted to an on condition, and the voltage of the node N rises, there is a danger of causing a malfunction whereby the voltage controlled switching element Q2 changes to an on condition due to the effect of the parasitic capacitor C.

SUMMARY OF THE INVENTION

Therefore, the invention, having been contrived focusing on the unsolved problem of the heretofore known example, has an object of providing a voltage controlled switching element gate drive circuit with which it is possible to suppress an occurrence of a malfunction, while suppressing surge voltage, surge current, and switching noise, when switching in a voltage controlled switching element.

In order to achieve the heretofore described object, a voltage controlled switching element gate drive circuit according to a first aspect of the invention is a gate drive circuit that supplies a gate signal to the gate of a voltage controlled switching element, thus driving the voltage controlled switching element, and includes a high potential side switching element and low potential side switching element connected in series, a first variable resistor interposed between at least the high potential side switching element and a high potential power supply or the low potential side switching element and a low potential power supply, and a control circuit that adjusts the resistance value of the first variable resistor.

Also, a voltage controlled switching element gate drive circuit according to a second aspect of the invention is such that the first variable resistor, being configured including an insulated gate transistor whose output resistance can be changed in accordance with an input signal, has a configuration in which the output resistance of the insulated gate transistor is changed in accordance with an input signal from the control circuit.

Also, a voltage controlled switching element gate drive circuit according to a third aspect of the invention is such that the first variable resistor has a configuration in which the output resistance of the insulated gate transistor is changed by applying the voltage across a second variable resistor, to which a constant current is supplied from a constant current source, between the gate and source of the insulated gate transistor, and adjusting the resistance value of the second variable resistor with the control circuit.

Also, a voltage controlled switching element gate drive circuit according to a fourth aspect of the invention is such that the second variable resistor has a configuration in which one or plural parallel circuits of a resistor and switching element are connected in series.

Also, a voltage controlled switching element gate drive circuit according to a fifth aspect of the invention is such that the second variable resistor has a configuration in which one or plural series circuits of a resistor and switching element are connected in parallel.

Also, a voltage controlled switching element gate drive circuit according to a sixth aspect of the invention is such that the second variable resistor has a configuration in which a switching element is further connected in parallel.

Also, a voltage controlled switching element gate drive circuit according to a seventh aspect of the invention is such that the first variable resistor has a configuration in which the voltage across a constant resistor, to which current from a variable current source is supplied, is applied between the gate and source of the insulated gate transistor, and the output current of the variable current source is adjusted with the control circuit.

Also, a voltage controlled switching element gate drive circuit according to an eighth aspect of the invention is such that the first variable resistor has a configuration in which one or plural parallel circuits of a resistor and switching element are connected in series.

Also, a voltage controlled switching element gate drive circuit according to a ninth aspect of the invention is such that the first variable resistor has a configuration in which one or plural series circuits of a resistor and switching element are connected in parallel.

Also, a voltage controlled switching element gate drive circuit according to a tenth aspect of the invention is such that the first variable resistor has a configuration in which a switching element is further connected in parallel.

According to the invention, as a voltage controlled switching element gate drive circuit includes a high potential side switching element and low potential side switching element connected in series, and a first variable resistor interposed between at least the high potential side switching element and a high potential power supply or the low potential side switching element and a low potential power supply, and the resistance value of the first variable resistor is adjusted with a control circuit, it is possible to adjust the resistance value of the first variable resistor as desired, it is possible to reduce the gate resistance value close to zero at a point at which a switching operation of a voltage controlled switching element that forms a control target is finished, and it is possible to suppress malfunction of the voltage controlled switching element.

DETAILED DESCRIPTION OF THE EMBODIMENTS

Hereafter, a description will be given, based on the drawings, of embodiments of the invention.

Figure 1:
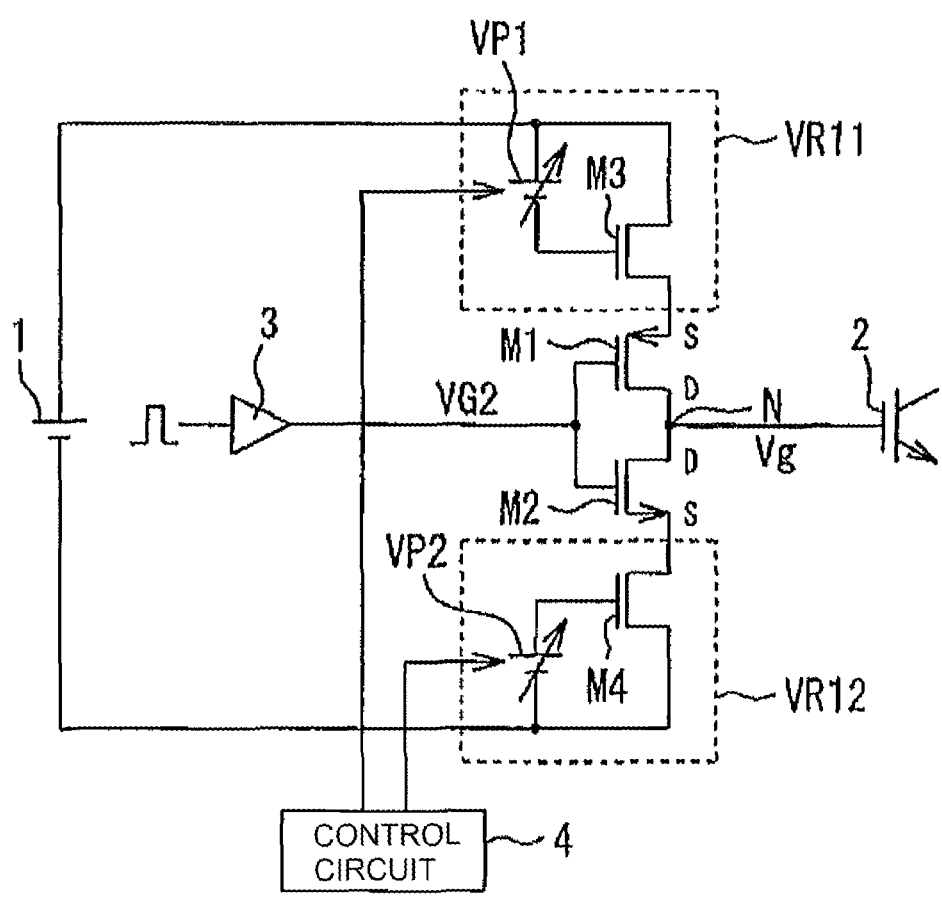
FIG. 1 is a circuit diagram showing a first embodiment of a voltage controlled switching element gate drive circuit according to the invention.

FIG. 1 is a circuit diagram showing a first embodiment of a voltage controlled switching element gate drive circuit according to the invention. In FIG. 1, the gate drive circuit has a direct current power source 1, and the source of a PMOS field effect transistor M1 is connected via a first variable resistor VR11 to the positive electrode side of the direct current power source 1.

The drain of the PMOS field effect transistor M1 is connected to the drain of an NMOS field effect transistor M2, and the source of the NMOS field effect transistor M2 is connected to the negative electrode side of the direct current power source 1 via a first variable resistor VR12.

Then, a node N, which is a connection point of the drain of the PMOS field effect transistor M1 and the drain of the NMOS field effect transistor M2, is connected to the gate of an insulated gate bipolar transistor (hereafter called an IGBT) 2 acting as a voltage controlled switching element that forms a control target.

Furthermore, the gates of the PMOS field effect transistor M1 and the NMOS field effect transistor M2 are connected to each other, and are connected to a first stage circuit 3 configured of, for example, an amplifier. A pulsed drive signal is input into the first stage circuit 3, and the first stage circuit 3 inversely amplifies (or non-inversely amplifies) the drive signal, and supplies it to the gates of the PMOS field effect transistor M1 and the NMOS field effect transistor M2. That is, when the drive signal is at a low level (when it is at a high level in the case of a non-inverse amplification), a power source voltage VDD1−VSS1 (VDD1 is the positive electrode potential of the direct current power source 1, while VSS1 is the negative electrode potential of the direct current power source 1) of the direct current power source 1 is output to the gates of the PMOS field effect transistor M1 and the NMOS field effect transistor M2 as a gate voltage, while when the drive signal is at a high level (when it is at a low level in the case of a non-inverse amplification), a zero gate voltage is output to the gates of the PMOS field effect transistor M1 and the NMOS field effect transistor M2.

Also, the variable resistor VR11 utilizes the output resistance of an insulated gate transistor element such as a MOSFET or IGBT, and includes a PMOS field effect transistor M3, of which the source is connected to the positive electrode side of the direct current power source 1 and the drain is connected to the source of the PMOS field effect transistor M1, and a variable voltage source VP1 connected between the gate of the PMOS field effect transistor M3 and a connection point between the source of the PMOS field effect transistor M3 and the direct current power source 1. Herein, the variable voltage source VP1 is such that the positive electrode side is connected to the connection point between the source of the PMOS field effect transistor M3 and the direct current power source 1, while the negative electrode side is connected to the gate of the PMOS field effect transistor M3.

Also, the variable resistor VR12 utilizes the output resistance of an insulated gate transistor element such as a MOSFET or IGBT, and includes an NMOS field effect transistor M4, of which the source is connected to the negative electrode side of the direct current power source 1 and the drain is connected to the source of the NMOS field effect transistor M2, and a variable voltage source VP2 connected between the gate of the NMOS field effect transistor M4 and a connection point between the source of the NMOS field effect transistor M4 and the direct current power source 1. Herein, the variable voltage source VP2 is such that the positive electrode side is connected to the gate of the NMOS field effect transistor M4, while the negative electrode side is connected to the connection point between the source of the NMOS field effect transistor M4 and the direct current power source 1.

Then, the voltages of the variable voltage sources VP1 and VP2 are controlled by a control circuit 4. A gate voltage Vg of the IGBT 2 or a gate voltage VG2 of the NMOS field effect transistor M2 is input into the control circuit 4, the variable voltage source VP1 is controlled in such a way that the gate-to-source voltage of the PMOS field effect transistor M3 decreases, and a variable resistance value R3, which is the output resistance value of the PMOS field effect transistor M3, is set high, during a period in which the gate voltage Vg shifts from a low level to a high level (or a period in which the gate voltage VG2 of the NMOS field effect transistor M2 shifts from a high level to a low level), and in other periods, the variable voltage source VP1 is controlled in such a way that the gate-to-source voltage of the PMOS field effect transistor M3 increases, and the variable resistance value R3, which is the output resistance value of the PMOS field effect transistor M3, is set low.

Also, the control circuit 4 controls the variable voltage source VP2 in such a way that the gate-to-source voltage of the NMOS field effect transistor M4 decreases, and a variable resistance value R4, which is the output resistance value of the NMOS field effect transistor M4, is set high, during a period in which the gate voltage Vg shifts from a high level to a low level (or a period in which the gate voltage VG2 of the NMOS field effect transistor M2 shifts from a low level to a high level), and in other periods, the control circuit 4 controls the variable voltage source VP2 in such a way that the gate-to-source voltage of the NMOS field effect transistor M4 increases, and the variable resistance value R4, which is the output resistance value of the NMOS field effect transistor M4, is set low.

Figure 2A:
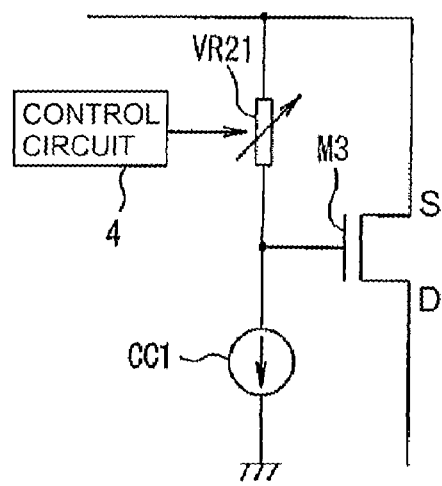
FIGS. 2A and 2B are circuit diagrams showing specific configurations of variable resistors of FIG. 1, wherein 2A is a circuit diagram of a variable resistor VR11, and 2B is a circuit diagram of a variable resistor VR12.

Then, as shown in FIG. 2A, a specific configuration of the variable voltage source VP1 is configured of a second variable resistor VR21, of which one end is connected to a connection point between the source of the PMOS field effect transistor M3 and the direct current power source 1, and a constant current source CC1 connected between the other end of the second variable resistor VR21 and the ground. Then, a connection point of the second variable resistor VR21 and constant current source CC1 is connected to the gate of the PMOS field effect transistor M3. Consequently, the voltage across the second variable resistor VR21 is applied between the gate and source of the PMOS field effect transistor M3.

Figure 2B:
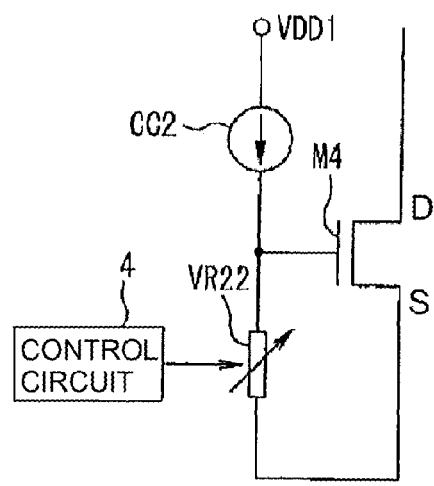

Also, as shown in FIG. 2B, a specific configuration of the variable voltage source VP2 is configured of a second variable resistor VR22, of which one end is connected to a connection point between the source of the NMOS field effect transistor M4 and the direct current power source 1, and a constant current source CC2 connected between the other end of the second variable resistor VR22 and the positive electrode of the direct current power source 1. Then, a connection point of the second variable resistor VR22 and constant current source CC2 is connected to the gate of the NMOS field effect transistor M4. Consequently, the voltage across the second variable resistor VR22 is applied between the gate and source of the NMOS field effect transistor M4.

Figure 3:
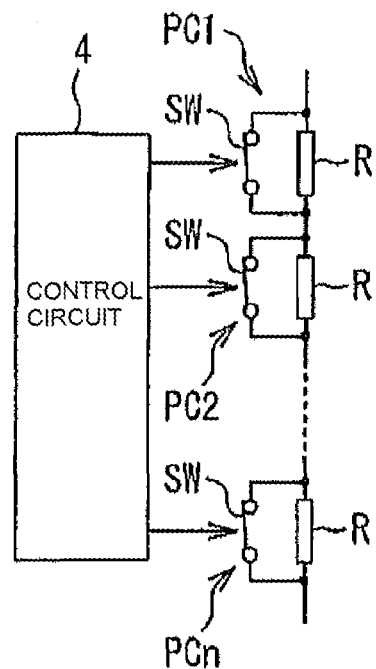
FIG. 3 is a circuit diagram showing a specific configuration of the variable resistors in FIGS. 2A and 2B.

Herein, a specific configuration of the variable resistors VR21 and VR22, as shown in FIG. 3, is such that one (n=1) or plural parallel circuits PC1 to PCn, wherein a resistor R and a switch SW configured of, for example, a semiconductor switching element are connected in parallel, are connected in series (in the case of one, there are two kinds of resistance value, 0 and R), and it is possible to set a minimum resistance value Rmin (when adopting a case in which all the switches SW are on (continuous) as the minimum resistance value, Rmin=0. There are applications with which Rmin is not 0) and a maximum resistance value Rmax by on-off controlling each switch SW with an output signal of the control circuit 4.

Figure 4:
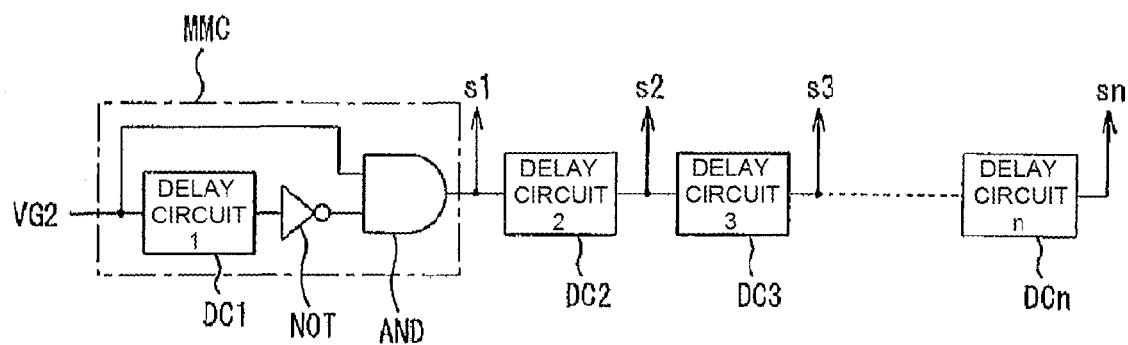
FIG. 4 is a block diagram showing an example of a specific configuration of a control circuit of FIG. 3.

Hereafter, to give a description with respect to the variable resistor VR12 of the NMOS field effect transistor M2 as an example of a specific configuration of the control circuit 4, the control circuit 4 is configured of a monostable circuit MMC, into which is input the gate voltage VG2 of the NMOS field effect transistor M2, and a number of delay circuits DC2, DC3, ..., DCn, corresponding to the number of parallel circuits PC, connected to the output side of the monostable circuit MMC, as shown in FIG. 4. Herein, the monostable circuit MMC is configured of a delay circuit DC1 into which the gate voltage VG2 is input, a logical inversion circuit NOT that inverts a delay output of the delay circuit DC1, and an AND circuit AND, into one input side of which the output of the logical inversion circuit NOT is input, and into the other input side of which the gate voltage VG2 is input.

Then, a control signal S1 output from the AND circuit AND, a control signal S2 output from the delay circuit DC2, a control signal S3 output from the delay circuit DC3, ..., and a control signal Sn output from the delay circuit DCn are supplied to the switches SW of the parallel circuits PC1, PC2, PC3, ..., and PCn. Herein, each switch SW is a switch that is turned on (continuous) when the control signal is at a high level, and turned off (discontinuous) when the control signal is at a low level.

Figure 5A:
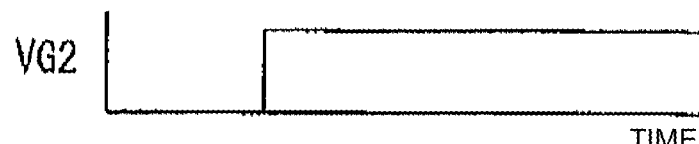
FIGS. 5A to 5F are signal waveform diagrams illustrating an operation of the control circuit of FIG. 4.
Figure 5B:
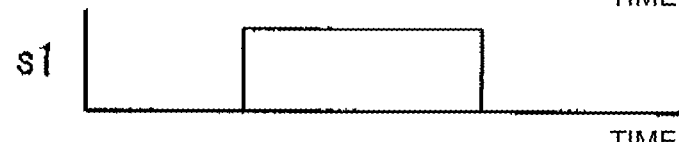
Figure 5C:
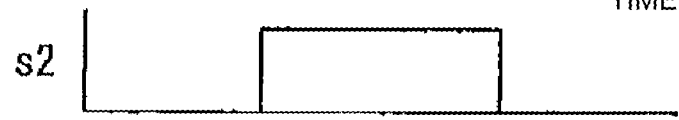
Figure 5D:
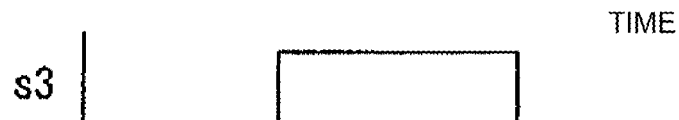
Figure 5E:
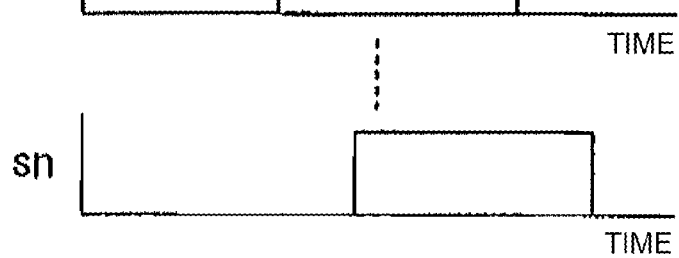
Figure 5F:
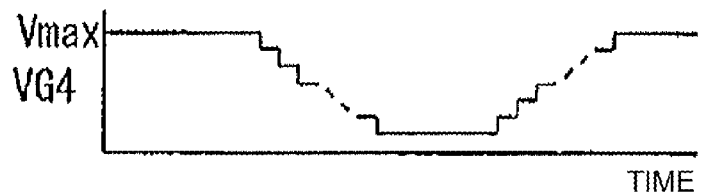

Consequently, when the gate voltage VG2 supplied to the NMOS field effect transistor M2 from the first stage circuit 3 is of zero potential, the control signal S1 output from the monostable circuit MMC is at a low level, and the control signals S2 to Sn output from the delay circuits DC1 to DCn respectively are also maintained at a low level. Because of this, as the resistors R of the parallel circuits PC1 to PCn are connected in series, the resistance value of the variable resistor VR22 is at the maximum resistance Rmax, and a gate voltage VG4 supplied to the gate of the NMOS field effect transistor M4 is at a maximum voltage Vmax, as shown in FIG. 5F. Because of this, the resistance value of the NMOS field effect transistor M4 is at a minimum value. Subsequently, on the gate voltage VG2 of the NMOS field effect transistor M2 rising to a predetermined voltage at a point t1, the voltage is supplied directly to the AND circuit AND. At this time, as the output of the delay circuit DC1 of the monostable circuit MMC is maintained at a low level, the voltage is inverted to a high level in the logical inversion circuit NOT, and supplied to the AND circuit AND, meaning that the output of the AND circuit AND is at a high level, as shown in FIG. 5B.

Because of this, the gate voltage VG4 supplied to the gate of the NMOS field effect transistor M4 decreases by the amount of the resistor R by the switch SW of the parallel circuit PC1 being in an on condition, as shown in FIG. 5F.

Subsequently, by the control signals S2 to Sn delayed by a predetermined time being output sequentially from the delay circuits DC2 to DCn, the gate voltage VG4 of the NMOS field effect transistor M4 decreases sequentially in increments of the resistor R, reaching a minimum voltage Vmin when the control signal Sn reaches a high level.

Subsequently, as the output of the logical inversion circuit NOT changes to a low level when the delay time of the delay circuit DC1 elapses, the control signal S1 returns to a low level. Because of this, the gate voltage VG4 of the NMOS field effect transistor M4 increases by the amount of the resistor R, as shown in FIG. 5F, after which, by the control signals S2 to Sn output sequentially from the delay circuits DC2 to DCn sequentially returning to a low level, the gate voltage VG4 of the NMOS field effect transistor M4 increases sequentially in increments of the resistor R, and the gate voltage VG4 of the NMOS field effect transistor M4 returns to the maximum voltage Vmax when the control signal Sn output from the final delay circuit DCn returns to a low level.

Next, a description will be given, referring to FIGS. 6A to 6D, of an action of the first embodiment.

Figure 6A:
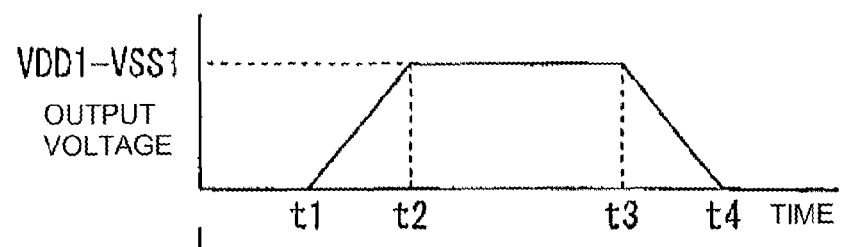
FIGS. 6A to 6D are signal waveform diagrams accompanying a description of an operation of the gate drive circuit of FIG. 1.
Figure 6B:
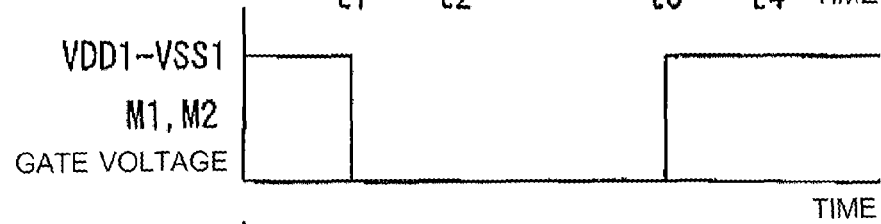

Now, to exemplify using a case in which the first stage circuit 3 inversely amplifies, in a condition in which a drive signal, which is an input signal of the first stage circuit 3, is at a low level, a gate voltage output from the first stage circuit 3 is at a high level, as shown in FIG. 6B. Because of this, the PMOS field effect transistor M1 is in an off condition, and the NMOS field effect transistor M2 is in an on condition.

Figure 6C:
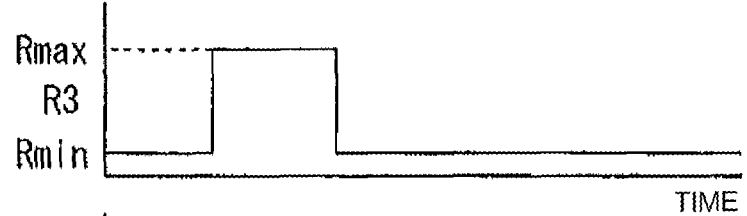

At this time, the first variable resistor VR11 is such that, as the gate-to-source voltage of the PMOS field effect transistor M3 is set high by the control circuit 4, the PMOS field effect transistor M3 is in an on condition, and the variable resistance value R3, which is the output resistance value of the PMOS field effect transistor M3, is at the minimum resistance value Rmin close to zero, as shown in FIG. 6C.

Figure 6D:
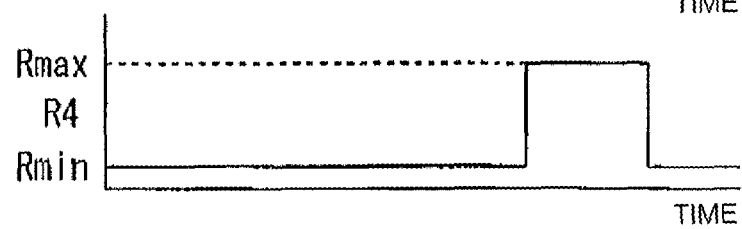

In the same way, the first variable resistor VR12 is also such that, as the gate-to-source voltage of the NMOS field effect transistor M4 is set high by the control circuit 4, the NMOS field effect transistor M4 is in an on condition, and the variable resistance value R4, which is the output resistance value of the NMOS field effect transistor M4, is at the minimum resistance value Rmin close to zero, as shown in FIG. 6D.

Because of this, as the gate of the IGBT 2 is connected to the negative electrode side of the direct current power source 1 via the NMOS field effect transistor M2 and via the variable resistor VR12, the gate capacitance of the IGBT 2 is discharged, and the IGBT 2 is in a turned off condition.

On the drive signal rising from a low level to a high level at the point t1 in this condition, the gate voltages of the PMOS field effect transistor M1 and the NMOS field effect transistor M2 output from the first stage circuit 3 drop to zero, as shown in FIG. 6B. Because of this, the PMOS field effect transistor M1 changes to an on condition, and the NMOS field effect transistor M2 changes to an off condition. Because of this, the gate voltage of the IGBT 2 gradually increases from zero, as shown in FIG. 6A. On the gate voltage of the IGBT 2 increasing from zero in this way, the control circuit 4 lowers the variable voltage source VP1, lowers the gate-to-source voltage of the PMOS field effect transistor M3, and sets the variable resistance value R3, which is the output resistance value of the PMOS field effect transistor M3, to the maximum resistance value Rmax, as shown in FIG. 6C. Actually, the resistance value of the variable resistor VR11, which is the output resistance value of the PMOS field effect transistor M3, gradually increases owing to the gate voltage VG3 of the PMOS field effect transistor M3 gradually decreasing as shown in FIG. 5F, but in FIG. 6C time is contracted, and the resistance value of the variable resistor VR11 is shown as increasing sharply.

Because of this, it is possible to suppress an occurrence of switching noise in the gate current when the gate voltage Vg supplied to the IGBT 2 rises. At this time, the variable resistor VR12 is maintained at the minimum resistance value Rmin, as shown in FIG. 6D.

Subsequently, when the gate voltage Vg reaches the power source voltage (VDD1−VSS1) of the direct current power source 1 at a point t2, the voltage of the variable voltage source VP1 is set in such a way that the gate-to-source voltage of the PMOS field effect transistor M3 increases, and the resistance value R3 of the variable resistor VR11 is set at the minimum resistance value Rmin, by the control circuit 4.

Herein, a period for which the resistance value R3 of the variable resistor VR11 is high can be set by adjusting the delay times of the delay circuits DC1, DC2, ..., DCn shown in FIG. 4.

Because of this, the gate voltage Vg supplied to the IGBT 2 is held at a low impedance, and it is possible to suppress an occurrence of malfunction caused by the effect of floating capacitance.

Subsequently, when the drive signal changes from a high level to a low level at a point t3, the gate voltage output from the first stage circuit 3 increases from zero to the power source voltage (VDD1–VSS1) of the direct current power source 1, as shown in FIG. 6B. Because of this, the variable voltage source VP2 is controlled by the control circuit 4 so as to decrease the gate-to-source voltage of the NMOS field effect transistor M4. Because of this, the resistance value R4 of the variable resistor VR12 is controlled to the maximum resistance value Rmax, as shown in FIG. 6D. In FIG. 6D too, the rise and fall of the resistance value R4 of the variable resistor VR12 are shown as being sharp by contracting the time. By reducing the number of the parallel circuits PC2, ..., PCn shown in FIG. 3 and delay circuits DC2, ..., DCn shown in FIG. 4, or by eliminating them, it is possible for the rise and fall of the resistance value R3 of the variable resistor VR11 and/or the resistance value R4 of the variable resistor VR12 to actually be made sharp.

Consequently, the gate capacitance charge of the IGBT 2 is discharged on the negative electrode side of the direct current power source 1 through the variable resistor VR12 at the maximum resistance value Rmax, the gate voltage Vg of the IGBT 2 is gradually reduced, as shown in FIG. 6A, and the gate voltage Vg of the IGBT 2 reaches zero at a point t4. As gate resistance is increased to the maximum resistance value Rmax during the period in which the gate voltage Vg of the IGBT 2 changes, surge voltage of the gate voltage Vg is suppressed. Herein, a period for which the resistance value R4 of the variable resistor VR12 is high can be set by adjusting the delay times of the delay circuits DC1, DC2, ..., DCn shown in FIG. 4.

As the gate voltage Vg reaches zero at the point t4, the voltage of the variable voltage source VP2 is set in such a way that the gate-to-source voltage of the NMOS field effect transistor M4 increases, and the resistance value R4 of the variable resistor VR12 is set at the minimum resistance value Rmin, by the control circuit 4. Because of this, the gate voltage Vg of the IGBT 2 can be held at a low impedance at the negative electrode potential VSS1 of the direct current power source 1, and it is possible to suppress malfunction caused by the effect of floating capacitance.

In this way, according to the first embodiment, it is possible, in a gate drive circuit that drives a voltage controlled switching element, to suppress malfunction caused by the effect of floating capacitance, while suppressing an occurrence of surge voltage and an occurrence of switching noise.

Moreover, as it is possible to adjust the gate-to-source voltage of the PMOS field effect transistor M3 and the NMOS field effect transistor M4 as desired with the variable voltage sources VP1 and VP2 configuring the first variable resistors VR11 and VR12, it is possible to freely adjust drive capability in accordance with the operating conditions of the IGBT 2. Also, by individually adjusting the delay times of the delay circuits DC1, ..., DCn, it is possible to freely adjust a gate waveform.

In the first embodiment, a description has been given of a case in which the variable resistors VR21 and VR22 configuring the variable voltage sources VP1 and VP2 have the configuration shown in FIG. 3 but, this not being limiting, plural series circuits SC1 to SCn, wherein a resistor R5 and switch SW are connected in series, may be connected in parallel, and finally a circuit of only a switch SW0, with the resistor R5 omitted, connected in parallel. In this case too, by controlling the switch of each series circuit SC1 to SCn, and of the circuit of only the switch SW0, with the control circuit 4, it is possible to set the minimum resistance value Rmin and maximum resistance value Rmax as desired. When there is no need for the minimum resistance value of the variable resistor VR21 and/or VR22 to be zero, the switch SW0 can be omitted.

Figure 8A:
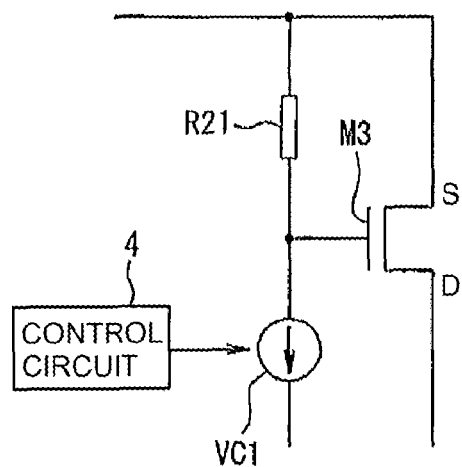
FIGS. 8A and 8B are circuit diagrams showing other examples of the variable resistors of FIG. 1, wherein 8A is a circuit diagram of the variable resistor VR11, and 8B is a circuit diagram of the variable resistor VR12.
Figure 8B:
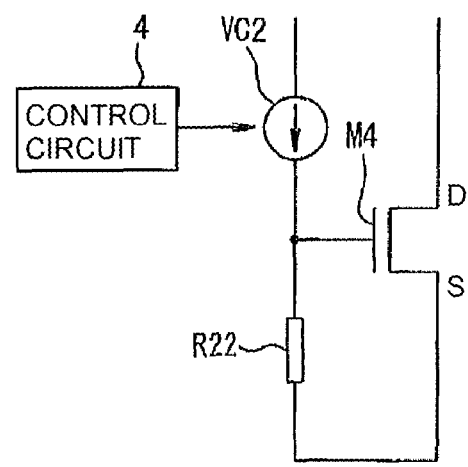

Also, in the heretofore described embodiment, a description has been given of a case in which the constant current source CC1 and variable resistor VR21, and the constant current source CC2 and variable resistor VR22, are applied as the variable voltage sources VP1 and VP2, as shown in FIGS. 2A and 2B, but, this not being limiting, it is also possible to produce the same working effect as that described above by replacing the variable resistors VR 21 and VR22 with constant resistors R21 and R22 having constant resistance values, or instead of this, replacing the constant current sources CC1 and CC2 with variable current sources VC1 and VC2, as shown in FIGS. 8A and 8B. It is possible to adopt the configuration shown in FIG. 9 as the variable current source VC2 in this case.

That is, the configuration is such that a current mirror circuit CMC is configured of two PMOS field effect transistors M5 and M6, a series circuit SC1 of a switch SW1 configured of, for example, a semiconductor switching element and an NMOS field effect transistor M7 is interposed between the drain of the PMOS field effect transistor M5 and a ground line (the potential VSS1), plural series circuits SC1, wherein the switch SW1 and NMOS field effect transistor M7 are connected in series in the same way, are connected in parallel to the series circuit SC1, and furthermore, a circuit SC11 of only the NMOS field effect transistor M7, wherein the switch SW1 is omitted, is connected in parallel.

Then, by on-off controlling the switch SW1 of each series circuit SC1 with the control circuit 4, it is possible to cause any current from a low current to a high current to flow from the PMOS field effect transistor M6 to the constant resistor R22, and by applying the voltage across the constant resistor R22 between the source and gate of the NMOS field effect transistor M4, it is possible to adjust the source-to-gate voltage, thus setting the variable resistance value. Herein, a voltage determining the current flowing through the M7 is applied to the gate of the NMOS field effect transistor M7.

Figure 9:
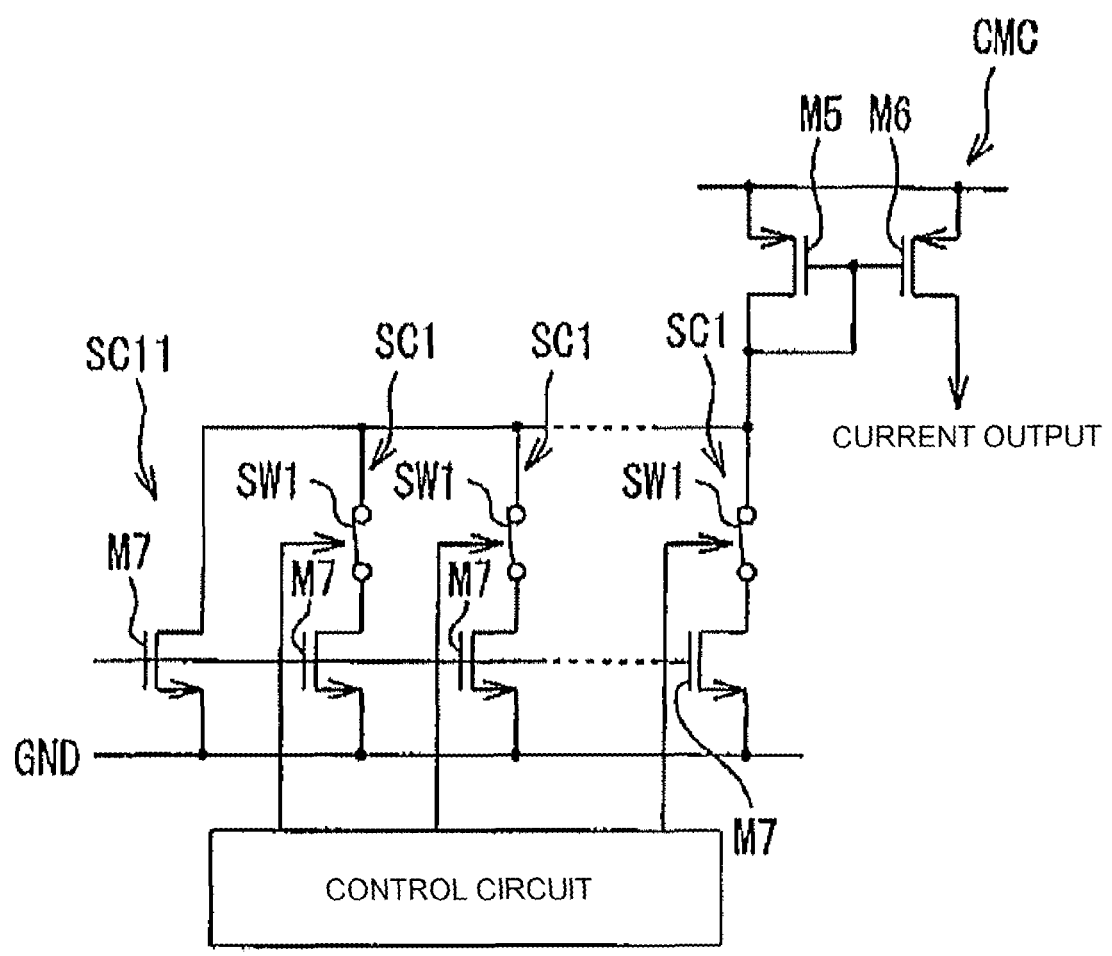
FIG. 9 is a circuit diagram showing a specific configuration of a variable current source VC2 of FIG. 8B.
Figure 10:
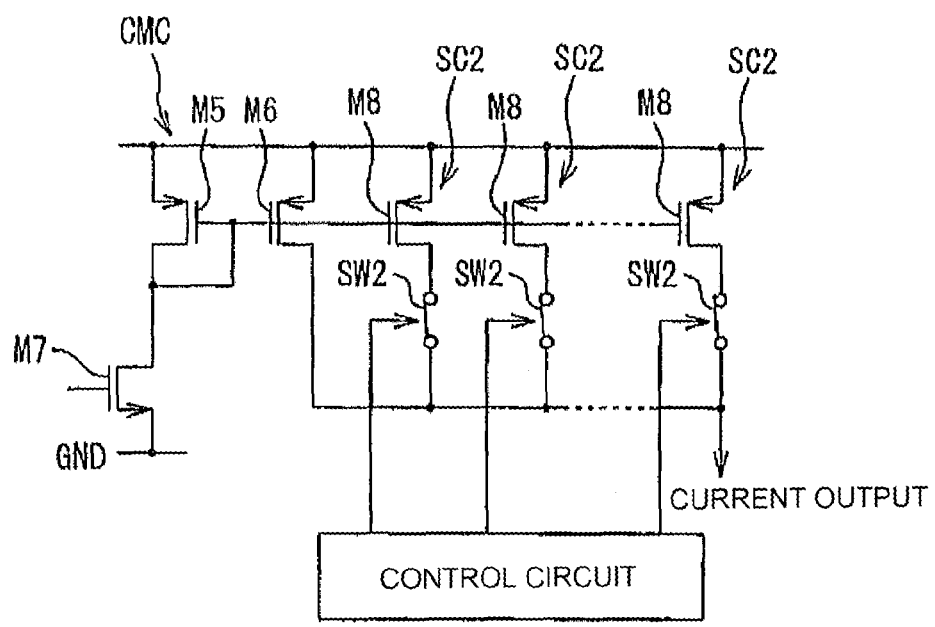
FIG. 10 is a circuit diagram showing another example of the variable current source VC2 of FIG. 8B.

Furthermore, it is also possible to parallel connect the PMOS field effect transistor M6 of the current mirror circuit CMC in FIG. 9 and plural PMOS field effect transistors M8 whose gates are commonly connected to the M6, and configure series circuits SC2 by connecting switches SW2 configured of, for example, semiconductor switching elements in series with the PMOS field effect transistors M8, as shown in FIG. 10, and to output a desired current value from the PMOS field effect transistor M6 and switches SW2 by on-off controlling each switch SW2 with the control circuit 4. In this case, the series circuits SC1 shown in FIG. 9 may be either omitted or not. FIG. 10 is a case wherein the series circuits SC1 are omitted, and only one NMOS field effect transistor M7 is left.

Also, the variable current source VC1 can also be configured in the same way by replacing the PMOS field effect transistors of FIGS. 9 and 10 with NMOS field effect transistors, replacing the NMOS field effect transistors with PMOS field effect transistors, and inverting the power source level.

Figure 11:
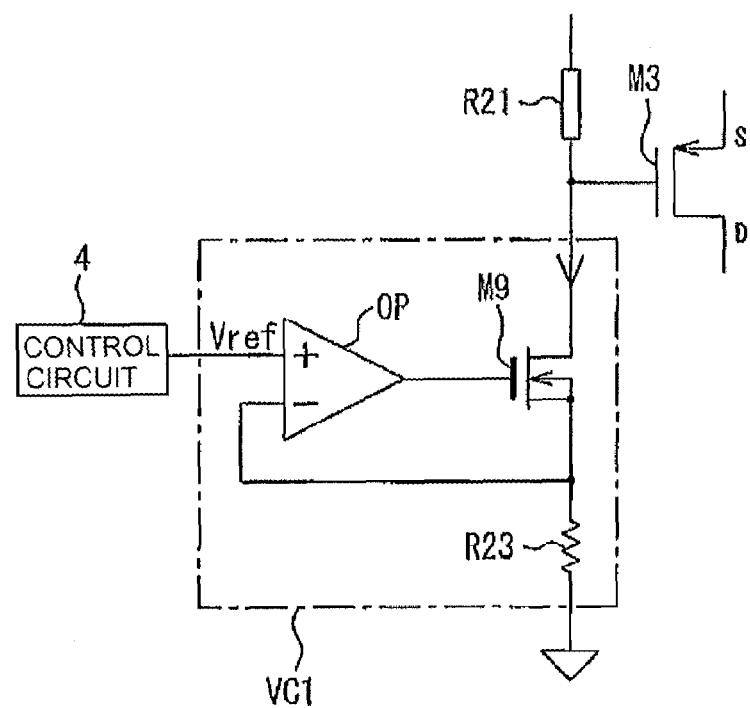
FIG. 11 is a circuit diagram showing a specific configuration of a variable current source VC1 of FIG. 8A.

Also, it is possible to adopt, as the variable current source VC1, a configuration in which a series circuit of an NMOS field effect transistor M9 and constant resistor R23 is interposed between a connection point of the constant resistor R21 and gate of the PMOS field effect transistor M3 and a ground line (the potential VSS1), the output terminal of an operational amplifier OP is connected to the gate of the NMOS field effect transistor M9, a reference voltage Vref is supplied from the control circuit 4 to the non-inverting input side of the operational amplifier OP, and a connection point of the source of the NMOS field effect transistor M9 and the resistor R23 is connected to the inverting input side, as shown in FIG. 11. According to this configuration, it is possible to cause a variable current (=Vref/R23) in accordance with the reference voltage Vref output from the control circuit 4 to flow to the constant resistor R21.

Also, the variable current source VC2 can also be configured in the same way by replacing the NMOS field effect transistor M9 of FIG. 11 with a PMOS field effect transistor, and inverting the power source level.

Next, a description will be given, referring to FIG. 12, of a second embodiment of the invention.

In the second embodiment, instead of a case of configuring a variable resistor by changing the output resistance of an MOS field effect transistor, a variable resistor is configured of plural resistors.

Figure 12:
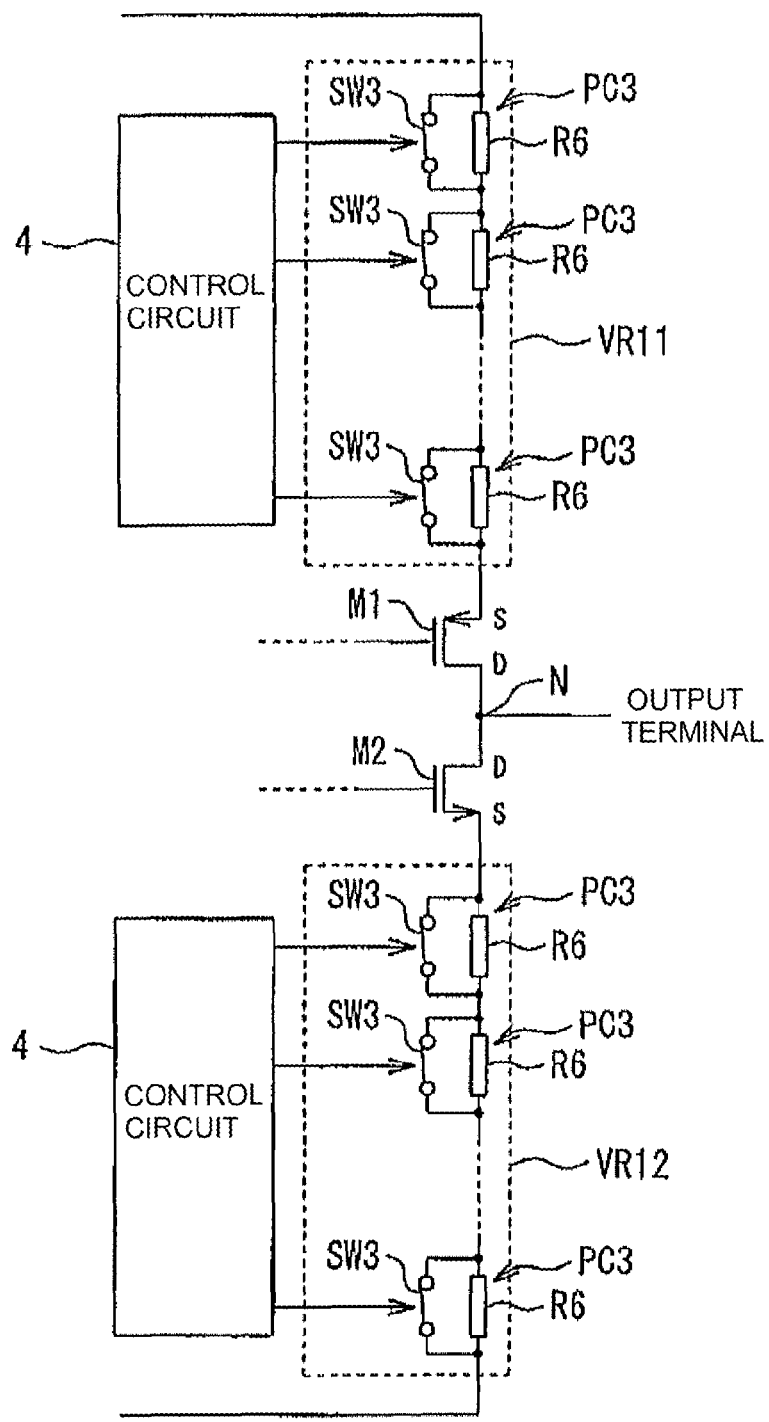
FIG. 12 is a circuit diagram showing a second embodiment of the invention.

That is, in the second embodiment, the variable resistors VR11 and VR12 are configured of one or plural parallel circuits PC3 of a resistor R6 and a switch SW3 configured of, for example, a semiconductor switching element, connected in series (in the case of one, there are two kinds of resistance value, 0 and R6), as shown in FIG. 12. Then, the switch SW3 of each parallel circuit PC3 is on-off controlled by the control circuit 4.

According to the second embodiment too, it is possible to set the minimum resistance value Rmin and maximum value Rmax by on-off controlling the switches SW3 of the parallel circuits PC3 configuring the variable resistors VR11 and VR12 with the control circuit 4 having the configuration of FIG. 4.

Consequently, by controlling the resistance value of the variable resistor VR11 to the maximum resistance value Rmax with the control circuit 4 when the gate voltage of the IGBT 2 rises, controlling the resistance value of the variable resistor VR11 to the minimum resistance value Rmin at other times, controlling the resistance value of the variable resistor VR12 to the maximum resistance value Rmax with the control circuit 4 when the gate voltage of the IGBT 2 falls, and controlling the resistance value of the variable resistor VR12 to the minimum value Rmin at other times, in the same way as in the first embodiment, it is possible to obtain the same working effect as in the first embodiment.

Figure 7:
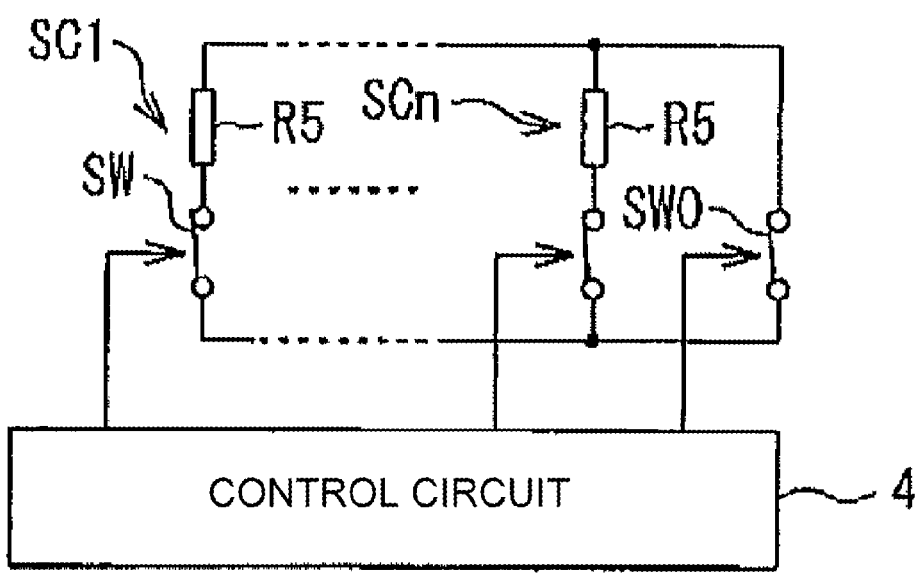
FIG. 7 is a circuit diagram showing another example of the variable resistors in FIGS. 2A and 2B.
Figure 13:
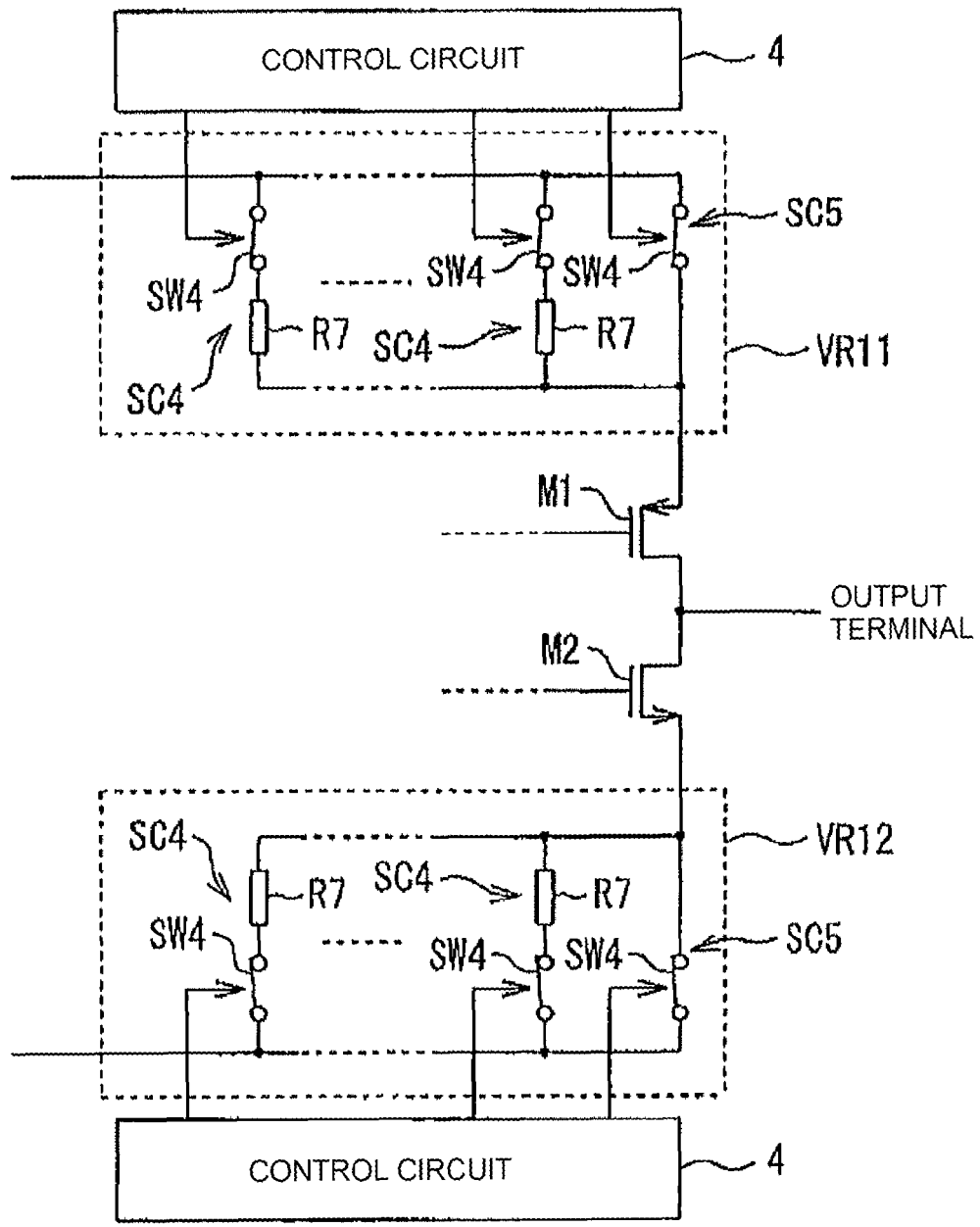
FIG. 13 is a circuit diagram showing a modification example of the second embodiment of the invention.
Figure 14:
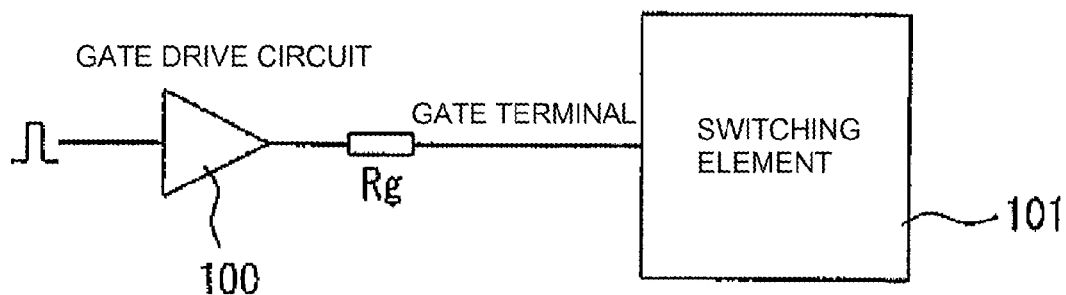
FIG. 14 is a block diagram showing a heretofore known gate drive circuit.
Figure 15:
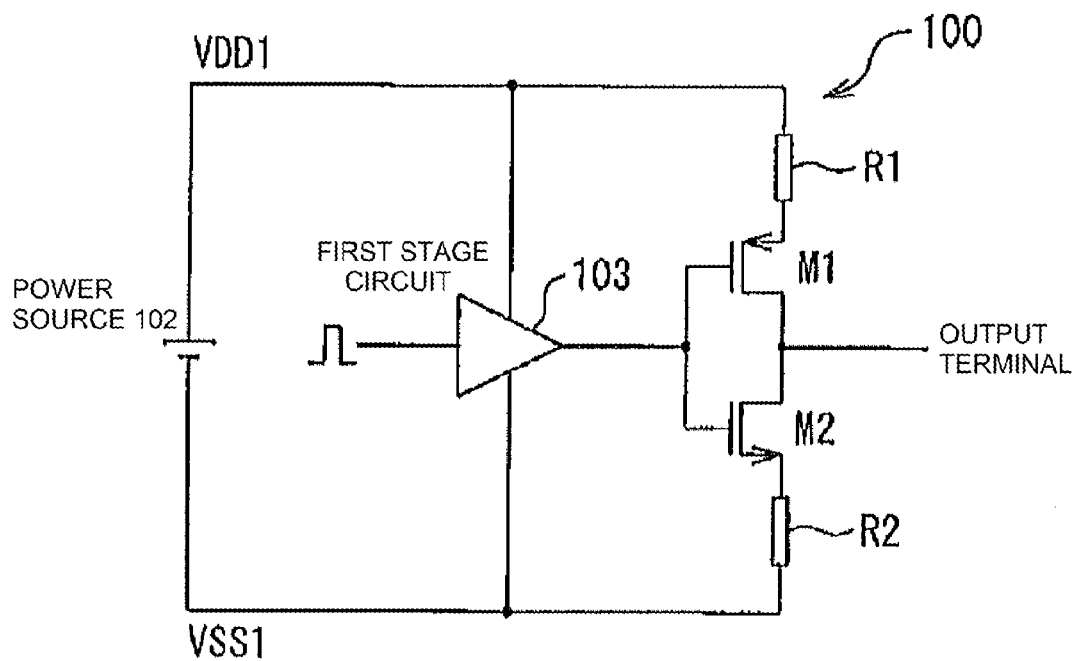
FIG. 15 is a circuit diagram showing a specific configuration of the heretofore known gate drive circuit.
Figure 16A:
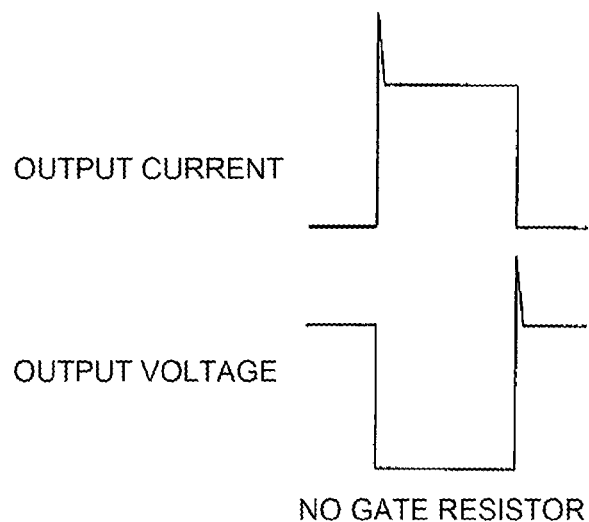
FIGS. 16A and 16B are diagrams showing output waveforms depending on the presence or absence of gate resistors in the gate drive circuit of FIG. 15.
Figure 16B:
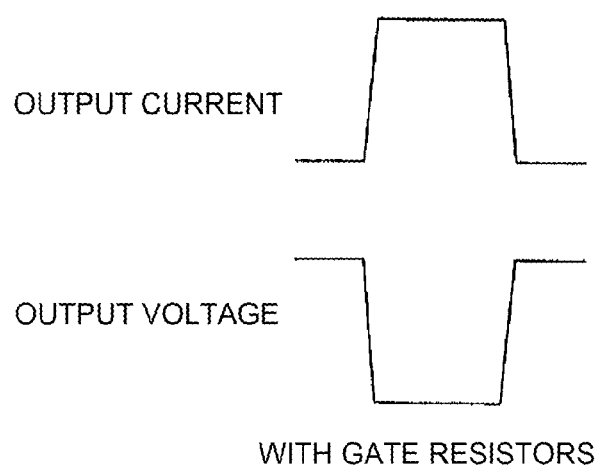
Figure 17:
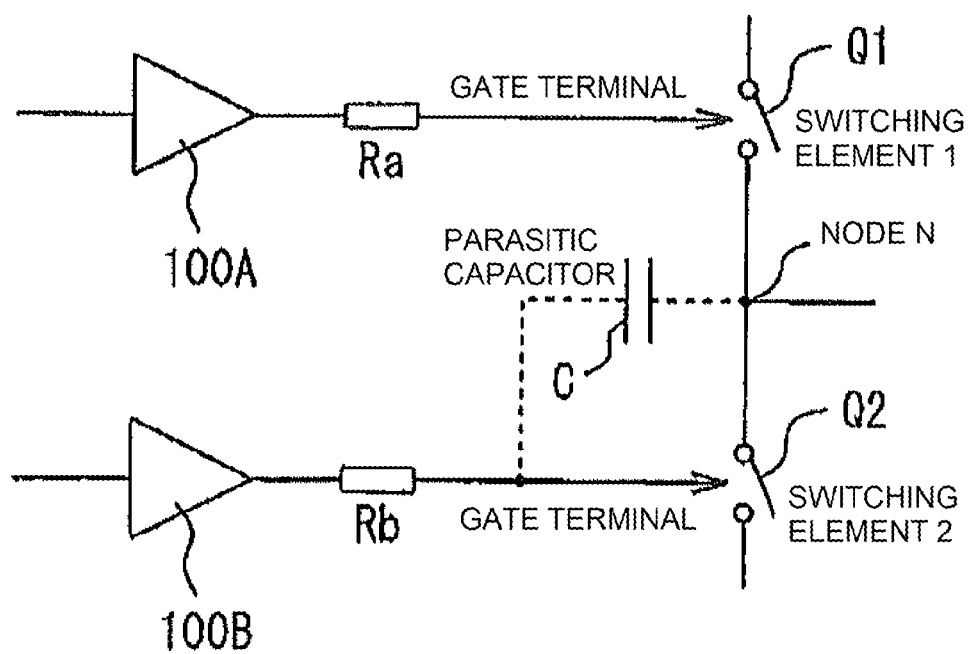
FIG. 17 is a circuit diagram showing an example of an application of the heretofore known gate drive circuit.
Figure 18:
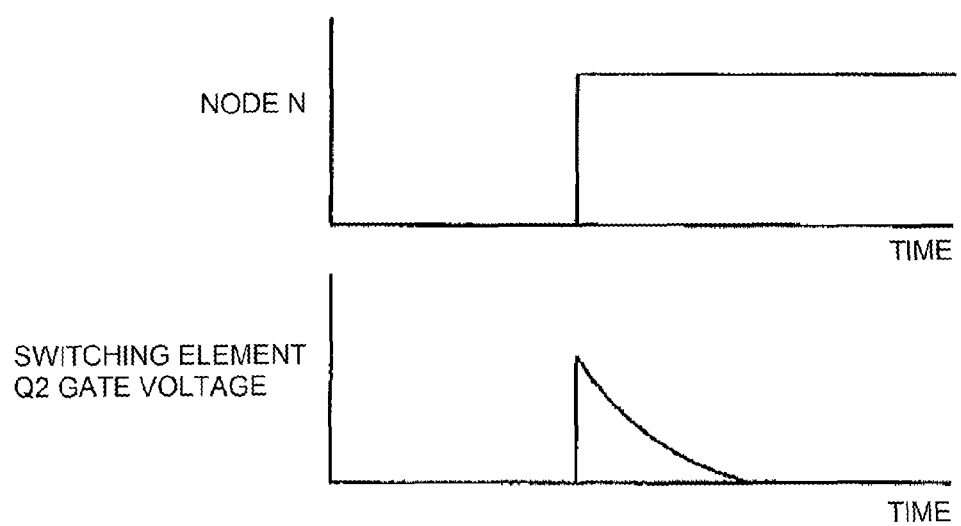
FIG. 18 shows voltage waveform diagrams corresponding to an operation of the gate drive circuit of FIG. 17.

In the second embodiment, a description has been given of a case wherein the variable resistors VR11 and VR12 are configured by connecting plural parallel circuits of the resistor R6 and switch SW3 in series, but it is also possible to configure the variable resistors VR11 and VR12, as shown in FIG. 13, by parallel connecting plural series circuits SC4, wherein a resistor R7 and switch SW4 are connected in series, in the same way as in FIG. 7, further connecting a circuit SC5 of only the switch SW4, wherein the resistor R7 is omitted, in parallel, and on-off controlling the switch SW4 of each circuit with the control circuit 4. When there is no need for the minimum resistance value Rmin to be zero, the circuit SC5 can be omitted.

Also, in the first and second embodiments, a description has been given of a case in which the variable resistors VR11 and VR12 are provided in the PMOS field effect transistor M1 and the NMOS field effect transistor M2 respectively but, this not being limiting, one of the variable resistors VR11 and VR12 may be replaced with a constant resistor.

Also, in the first and second embodiments, a description has been given of a case in which the IGBT 2 is applied as a voltage controlled switching element but, this not being limiting, it is possible to drive another voltage controlled switching element, such as a MOS field effect transistor.

It will be apparent to one skilled in the art that the manner of making and using the claimed invention has been adequately disclosed in the above-written description of the exemplary embodiments taken together with the drawings. Furthermore, the foregoing description of the embodiments according to the invention is provided for illustration only, and not for limiting the invention as defined by the appended claims and their equivalents. It will be understood that the above description of the exemplary embodiments of the invention are susceptible to various modifications, changes and adaptations, and the same are intended to be comprehended within the meaning and range of equivalents of the appended claims.

What is claimed is:

1. A voltage controlled switching element gate drive circuit that supplies a gate signal to a gate of a voltage controlled switching element to drive the voltage controlled switching element, the gate drive circuit comprising:
    a high potential side switching element and low potential side switching element connected in series;
    a first variable resistor interposed between at least the high potential side switching element and a high potential power supply or the low potential side switching element and a low potential power supply; and
    a control circuit that adjusts a resistance value of the first variable resistor;
    wherein the first variable resistor includes a constant-value resistor coupled to a variable-current source; and
    wherein the first variable resistor further includes a switching element coupled to a node common to the constant-value resistor and the variable-current source.

2. The voltage controlled switching element gate drive circuit according to claim 1, wherein
    the first variable resistor includes an insulated gate transistor and an output resistance of the insulated gate transistor is changeable in accordance with an input signal from the control circuit.

3. The voltage controlled switching element gate drive circuit of claim 1, wherein the variable-current source comprises a current mirror coupled to at least one switch controlled by the control circuit.

4. A voltage controlled switching element gate drive circuit that supplies a gate signal to a gate of a voltage controlled switching element to drive the voltage controlled switching element, the gate drive circuit comprising:
    a high potential side switching element and low potential side switching element connected in series;
    a first variable resistor interposed between at least the high potential side switching element and a high potential power supply or the low potential side switching element and a low potential power supply; and
    a control circuit that adjusts a resistance value of the first variable resistor;
    wherein
    the first variable resistor includes an insulated gate transistor and an output resistance of the insulated gate transistor is changeable in accordance with an input signal from the control circuit; and wherein the first variable resistor has a configuration in which a voltage across a constant resistor, to which an output current from a variable current source is supplied, is applied between a gate and source of the insulated gate transistor, and the output current of the variable current source is adjusted with the control circuit.

5. An apparatus comprising:

a first switching element;

a second switching element coupled to the first switching element;

a first adjustable-resistance device coupled between the first switching element and a first terminal of a voltage source;

a second adjustable-resistance device coupled between the first switching element and a second terminal of the voltage source; and a control device configured to adjust a first resistance value corresponding to the first adjustable-resistance device, and a second resistance value corresponding to the second adjustable-resistance device;

wherein at least one of the first adjustable-resistance device or the second adjustable-resistance device includes a constant-value resistance coupled to a variable-current source; and wherein the at least one of the first adjustable-resistance device or the second adjustable-resistance device includes a switching element coupled to a common node of the constant-value resistance and the variable-current source.

6. The apparatus of claim 5, wherein the variable-current source comprises a current mirror coupled to at least one switch controlled by the control circuit.

* * * * *